United States Patent
Luo et al.

(10) Patent No.: US 11,817,317 B2
(45) Date of Patent: Nov. 14, 2023

(54) HIGH-SILICON-CONTENT WET-REMOVABLE PLANARIZING LAYER

(71) Applicant: Brewer Science, Inc., Rolla, MO (US)

(72) Inventors: Ming Luo, Creve Coeur, MO (US);
Yubao Wang, Rolla, MO (US);
Kaumba Sakavuyi, Rolla, MO (US);
Vandana Krishnamurthy, Rolla, MO (US)

(73) Assignee: Brewer Science, Inc., Rolla, MO (US)

( * ) Notice: Subject to any disclaimer, the term of this patent is extended or adjusted under 35 U.S.C. 154(b) by 479 days.

(21) Appl. No.: 17/079,916

(22) Filed: Oct. 26, 2020

(65) Prior Publication Data
US 2021/0125829 A1     Apr. 29, 2021

Related U.S. Application Data

(60) Provisional application No. 62/925,259, filed on Oct. 24, 2019.

(51) Int. Cl.
| | | |
|---|---|---|
| *H01L 21/033* | (2006.01) | |
| *G03F 1/46* | (2012.01) | |
| *H01L 21/027* | (2006.01) | |

(52) U.S. Cl.
CPC .......... *H01L 21/0332* (2013.01); *G03F 1/46* (2013.01); *H01L 21/0271* (2013.01)

(58) Field of Classification Search
CPC ............ H01L 21/0332; H01L 21/0271; H01L 21/02126; H01L 21/02216; H01L 21/02282; H01L 21/0337; G03F 1/46
USPC .......................................................... 438/761
See application file for complete search history.

(56) References Cited

U.S. PATENT DOCUMENTS

| | | |
|---|---|---|
| 7,754,818 B2 | 7/2010 | Bhave et al. |
| 9,196,484 B2 | 11/2015 | Takeda et al. |
| 9,442,377 B1 | 9/2016 | Ongayi et al. |
| 9,482,951 B2 | 11/2016 | Sullivan et al. |
| 10,007,184 B2 | 6/2018 | Cui et al. |
| 10,082,735 B2 | 9/2018 | Shibayama et al. |
| 10,114,288 B2 | 10/2018 | Cutler et al. |
| 10,372,039 B2 | 8/2019 | Kanno et al. |

(Continued)

FOREIGN PATENT DOCUMENTS

WO     2019/082934     5/2019

OTHER PUBLICATIONS

International Search Report and Written Opinion dated Mar. 12, 2021 in corresponding PCT/US2020/057317 filed Oct. 26, 2020, 8 pages.

(Continued)

*Primary Examiner* — Caleen O Sullivan
(74) *Attorney, Agent, or Firm* — HOVEY WILLIAMS LLP

(57) ABSTRACT

Lithographic compositions for use as wet-removable silicon gap fill layers are provided. The method of using these compositions involves utilizing a silicon gap fill layer over topographic features on a substrate. The silicon gap fill layer can either be directly applied to the substrate, or it can be applied to any intermediate layer(s) that may be applied to the substrate. The preferred silicon gap fill layers are formed from spin-coatable, polymeric compositions with high silicon content, and these layers exhibit good gap fill and planarization performance and high oxygen etch resistance.

37 Claims, 2 Drawing Sheets

(56) References Cited

U.S. PATENT DOCUMENTS

| | | |
|---|---|---|
| 2014/0024191 A1 | 1/2014 | Chen et al. |
| 2015/0210829 A1 | 7/2015 | Shibayama et al. |
| 2015/0346601 A1 | 12/2015 | Wu et al. |
| 2016/0363861 A1 | 12/2016 | Ongayi et al. |
| 2018/0059546 A1 | 3/2018 | Cui et al. |
| 2018/0253006 A1 | 9/2018 | Cui et al. |
| 2021/0057219 A1* | 2/2021 | Liang et al. |
| 2021/0181635 A1* | 6/2021 | Shibayama ............. G03F 7/423 |

OTHER PUBLICATIONS

Machine Translation of WO2019082934, 52 pages.

* cited by examiner

HIGH-SILICON-CONTENT WET-REMOVABLE PLANARIZING LAYER

RELATED APPLICATIONS

The present application claims the priority benefit of U.S. Provisional Patent Application Ser. No. 62/925,259, filed Oct. 24, 2019, entitled HIGH-SILICON-CONTENT WET-REMOVABLE PLANARIZING HARDMASK, incorporated by reference in its entirety herein.

BACKGROUND

Field

This invention relates to methods of fabricating microelectronic structures using lithography.

Description of Related Art

As the semiconductor industry continues to follow Moore's law, the demand for ever-decreasing feature sizes requires the use of innovative processes and materials to attain well-defined features. Importantly, a flat surface must be created in order to allow the focus length necessary to enable shorter lithography wavelengths and smaller features. High-silicon-content materials (25%40%) are promising gap-fill materials for creating planar surfaces for lithography as well as providing better etch resistance, thus enabling high-fidelity pattern transfer processes. However, the high silicon content and siloxane network structure of these materials make their removal challenging. Fluorine-containing plasma and hydrofluoric acid can be used to remove (or strip) these silicon-containing layers. However, both fluorine plasma and hydrofluoric acid will remove not only these silicon-containing materials, but also other materials that should remain intact, such as the substrate. Wet stripping using tetramethylammonium hydroxide in higher concentrations, such as ≥5 wt. %, can be used to remove at least some of these silicon-containing layers, but these higher concentrations of tetramethylammonium hydroxide can also be damaging to the substrate. Silicon-containing layers having a relatively low amount of silicon can sometimes be removed using "piranha acid" (concentrated sulfuric acid and hydrogen peroxide), but such an approach has not proven successful with silicon-containing materials having higher silicon content.

As structures are becoming smaller with very high aspect ratios, it has become imperative to find silicon-containing materials that can fill gaps between structures with very high aspect ratios while achieving good planarization so that multiple lithographic patterning processes can be carried out to produce more complicated structures. Silicon-containing, gap-fill materials with high etch resistance are needed that can be removed after processing without damaging the adjacent structures or substrates.

SUMMARY

In one embodiment the present disclosure is broadly concerned with a method of forming a structure, where the method comprises providing a substrate comprising a surface comprising topographic features. The substrate optionally includes one or more intermediate layers on its surface. A composition is applied to the substrate surface, or on the one or more intermediate layers, if present, so as to form a planarizing layer. The composition comprises a polymer comprising [3-(triethoxysilyl)propyl]succinic anhydride monomers. (I), (II), (III), (IV), or (V) is performed:

(I) forming a silicon hardmask layer on the planarizing layer;
  optionally forming an antireflective layer on the silicon hardmask layer; and
  forming a photoresist layer on the silicon hardmask layer, or on the antireflective layer, if present;

(II) forming a silicon hardmask layer on the planarizing layer;
  forming a carbon-rich layer on the silicon hardmask layer;
  optionally forming an antireflective layer on the carbon-rich layer; and
  forming a photoresist layer on the carbon-rich layer, or on the antireflective layer, if present;

(III) forming a carbon-rich layer on the planarizing layer;
  optionally forming an antireflective layer on the carbon-rich layer; and
  forming a photoresist layer on the carbon-rich layer, or on the antireflective layer, if present;

(IV) forming a carbon-rich layer on the planarizing layer;
  forming a silicon hardmask layer on the carbon-rich layer;
  optionally forming an antireflective layer on the silicon hardmask layer; and
  forming a photoresist layer on the silicon hardmask layer, or on the antireflective layer, if present; or (V) forming an antireflective layer on the planarizing layer; and
  forming a photoresist layer on the antireflective layer.

In another embodiment, the invention provides a structure comprising a substrate comprising a surface comprising topographic features. The substrate optionally includes one or more intermediate layers on its surface. A planarizing layer is on the substrate surface or on the one or more intermediate layers, if present, with the planarizing layer comprising a polymer comprising [3-(triethoxysilyl)propyl]succinic anhydride monomers. The structure also comprises one of (I), (II), (III), (IV), or (V):

(I) a silicon hardmask layer on the planarizing layer;
  optionally an antireflective layer on the silicon hardmask layer; and
  a photoresist layer on the silicon hardmask layer, or on the antireflective layer, if present;

(II) a silicon hardmask layer on the planarizing layer;
  a carbon-rich layer on the silicon hardmask layer;
  optionally an antireflective layer on the carbon-rich layer; and
  a photoresist layer on the carbon-rich layer, or on the antireflective layer, if present;

(III) a carbon-rich layer on the planarizing layer;
  optionally an antireflective layer on the carbon-rich layer; and
  a photoresist layer on the carbon-rich layer, or on the antireflective layer, if present;

(IV) a carbon-rich layer on the planarizing layer;
  a silicon hardmask layer on the carbon-rich layer;
  optionally an antireflective layer on the silicon hardmask layer; and
  a photoresist layer on the silicon hardmask layer, or on the antireflective layer, if present; or (V) an antireflective layer on the planarizing layer; and
  a photoresist layer on the antireflective layer.

In a further embodiment, the invention provides a method of forming a structure, where the method comprises providing a substrate comprising a surface comprising topographic features. The substrate optionally includes one or more intermediate layers on the substrate surface. A composition is applied to the substrate surface, or on the one or more intermediate layers, if present, so as to form a planarizing layer. The composition comprises a polymer comprising about 1 mol % to about 10 mol % [3-(triethoxysilyl)propyl] succinic anhydride monomers. The planarizing layer is resistant to oxygen etching so that it would experience less than about 5% thickness loss if exposed to oxygen etching for about 2 minutes. A photoresist layer is formed on the planarizing layer.

In yet a further embodiment, a structure is provided that comprises a substrate comprising a surface comprising topographic features. The substrate optionally includes one or more intermediate layers on the substrate surface. A planarizing layer is on the substrate surface or on the one or more intermediate layers, if present. The planarizing layer comprises a polymer comprising about 1 mol % to about 10 mol % [3-(triethoxysilyl)propyl]succinic anhydride monomers, and the planarizing layer is resistant to oxygen etching so that it would experience less than about 5% thickness loss if exposed to oxygen etching for about 2 minutes. A photoresist layer on the planarizing layer.

A composition comprising a polymer dispersed or dissolved in a solvent system is also provided in a further embodiment. The polymer comprises:
  (i) about 1 mol % to about 10 mol % [3-(triethoxysilyl)propyl]succinic anhydride monomers, about 35 mol % to about 85 mol % methyltrimethoxysilane, and about 15 mol % to about 60 mol % tetraethoxysilane;
  (ii) about 1 mol % to about 10 mol % [3-(triethoxysilyl)propyl]succinic anhydride monomers, about 35 mol % to about 85 mol % methyltrimethoxysilane, about 15 mol % to about 60 mol % tetraethoxysilane, and about 1 mol % to about 5 mol % 2-(3,4-epoxycyclohexyl)-ethyltrimethyoxysilane; or
  (iii) about 1 mol % to about 10 mol % [3-(triethoxysilyl)propyl]succinic anhydride monomers, about 15 mol % to about 60 mol % tetraethoxysilane, about 1 mol % to about 5 mol % 2-(3,4-epoxycyclohexyl)-ethyltrimethyoxysilane, and about 15 mol % to about 70 mol % methyltriethoxysilane.

DETAILED DESCRIPTION

Figure 1:
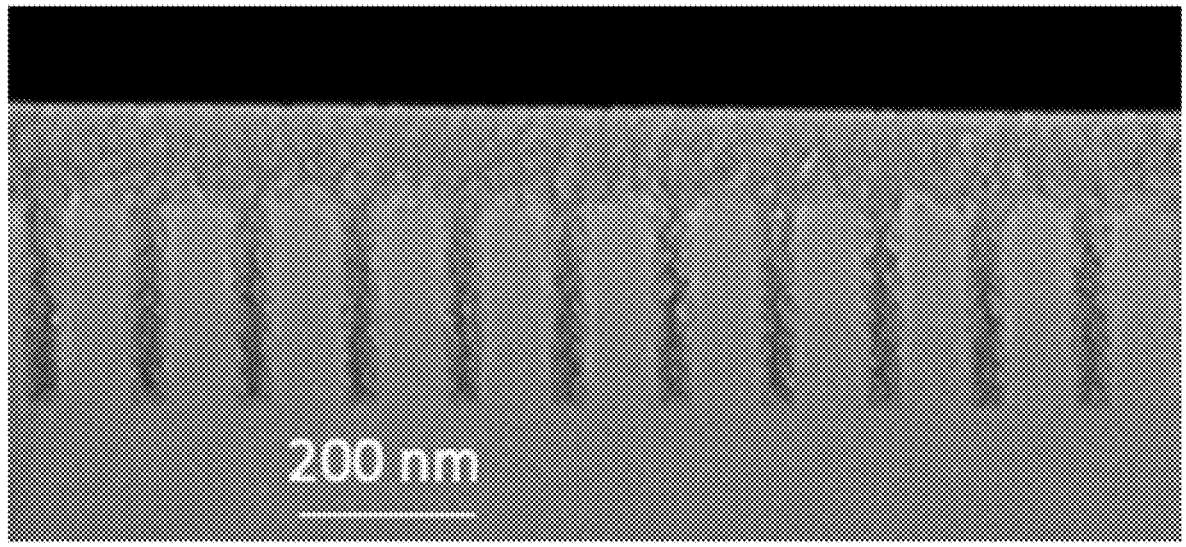
FIG. 1 is a SEM cross-section of the planarization performance over dense features of the Example 1 formulation when formed into a layer as described in Example 9.

In more detail, the present invention broadly provides compositions for use in forming silicon planarizing layers.

Planarizing Compositions

1. Polymers for Use in Compositions

Preferred polymers for use in the novel planarizing compositions comprise [3-(triethoxysilyl)propyl]succinic anhydride ("TEOSPSA") monomers. Preferably, the polymer further comprises one or more additional monomers chosen from:

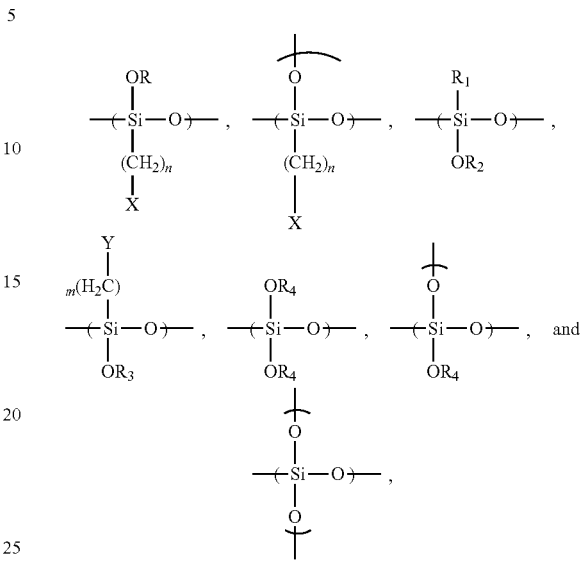

where:

each R is individually chosen from $C_1$ to about $C_6$ alkyls (preferably $C_1$ to about $C_3$ alkyls) and hydrogen;

each $R_1$ is individually chosen from $C_1$ to about $C_6$ alkyls (preferably $C_1$ to about $C_3$ alkyls) and from $C_6$ to about $C_{20}$ aryls (preferably $C_6$ to about $C_{14}$ aryls);

each $R_2$ is individually chosen from $C_1$ to about $C_6$ alkyls (preferably $C_1$ to about $C_3$ alkyls) and hydrogen;

each $R_3$ is individually chosen from $C_1$ to about $C_6$ alkyls (preferably $C_1$ to about $C_3$ alkyls) and hydrogen;

each $R_4$ is individually chosen from $C_1$ to about $C_6$ alkyls (preferably $C_1$ to about $C_3$ alkyls) and hydrogen;

m is 1 to about 6, and more preferably from 1 to about 3;

n is 1 to about 6, and more preferably from 1 to about 3;

each X is individually chosen from glycidoxy, epoxy, epoxycycloalkyls (preferably $C_3$ to about $C_{10}$ cycloalkyls, and preferably $C_1$ to about $C_6$ cycloalkyls), acetamido, and isocyanurate moieties; and each Y is individually chosen from acetoxy, ester, and aryl moieties. Preferred aryl moieties for Y are $C_6$ to about $C_{20}$, more preferably $C_6$ to about $C_{14}$, and most preferably $C_6$.

Preferred additional monomers falling within the above general structures include those chosen from chosen from (3-glycidoxypropyl)trimethoxysilane, 5,6-epoxyhexyl-triethoxysilane, 2-(3,4-epoxycyclohexyl)-ethyltrimethyoxysilane ("ECHETMS"), (3-acetamidopropyl)-trimethoxysilane, (1,3-di-2-propen-1-yl)-5-(([3-triethoxysilylpropyl])-(1,3,5-triazine-2,4,6 (1H, 3H, 5H)-trione), methyltrimethoxysilane ("MTMS"), methyltriethoxysilane ("MTEOS"), dimethyldimethoxysilane, dimethyldiethoxysilane, phenyltrimethoxysilane, phenethyl-trimethoxysilane ("PETMS"), 2-(carbomethoxy)ethyltrimethoxysilane ("CMETMS"), acetoxyethyltrimethoxysilane, ethyltrimethoxysilane ("ETMS"), n-butyltrimethoxysilane, tetraethoxysilane ("TEOS"), tetramethyl orthosilicate ("TMOS"), and mixtures thereof. Particularly preferred additional monomers are chosen from ECHETMS, MTMS, MTEOS, and/or TEOS, and preferably at least two of the foregoing.

It will be appreciated that the ratios and loading of monomers may be tuned to provide the appropriate properties (e.g., carbon content, silicon content, wet etch rate, dry etch rate, adhesion, and gelling) of the planarizing composition and/or planarizing layer formed from the composition. In a preferred embodiment, the molar percentage of TEOSPSA in the polymer comprises from about 1 mol % to about 10 mol %, and more preferably from about 2 mol % to about 5 mol %.

In another embodiment, the polymer comprises ECHETMS as an additional monomer. In this embodiment, ECHETMS is preferably present in the polymer from about 1 mol % to about 5 mol %, and more preferably from about 1 mol % to about 2 mol %.

In another embodiment, MTMS is an additional monomer present in the polymer from about 35 mol % to about 85 mol %, and preferably from about 40 mol % to about 70 mol %.

In a further embodiment, TEOS is used as an additional monomer and is present in the polymer at a molar ratio of about 15 mol % to about 60 mol %, and preferably from about 30 mol % to about 50 mol %. In yet a further embodiment, TEOS is present as an additional monomer at a molar ratio of less than about 45 mol %, preferably about 15 mol % to about 45 mol %, more preferably from about 20 mol % to about 40 mol %, and even more preferably from about 25 mol % to about 35 mol %.

In yet a further embodiment, MTEOS is an additional monomer present in the polymer from about 15 mol % to about 70 mol %, and preferably from about 30 mol % to about 60 mol %.

In another embodiment, the combination of MTMS, TEOS, and MTEOS present in the polymer is from about 85 mol % to about 98 mol %, more preferably from about 90 mol % to about 96 mol %.

In one embodiment, the polymer comprises, consists of, or even consists essentially of TEOSPSA and one or more (in any combination) of the above-described additional monomers.

In another embodiment, the polymer comprises, consists of, or even consists essentially of TEOSPSA, ECHETMS, MTMS, and TEOS, preferably in the above molar percentages.

In another embodiment, the polymer comprises, consists of, or even consists essentially of TEOSPSA, ECHETMS, MTEOS, and TEOS, preferably in the above molar percentages.

In yet another embodiment, the polymer comprises, consists of, or even consists essentially of TEOSPSA, MTMS, and TEOS, preferably in the above molar percentages.

In a further embodiment, the polymer comprises, consists of, or even consists essentially of TEOSPSA, ECHETMS, TEOS, and MTMS in the following molar ratios:

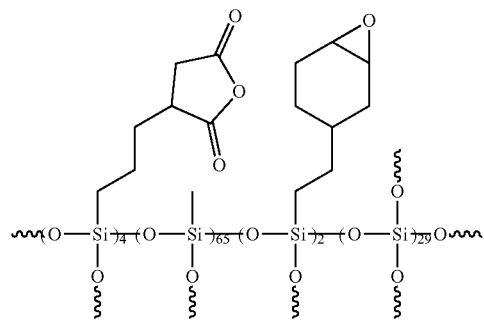

It is preferred that the polymer comprise less than about 10 mol % phenyltrimethoxysilane monomers, preferably less than about 5 mol % phenyltrimethoxysilane monomers, more preferably less than about 1 mol % phenyltrimethoxysilane monomers, and even more preferably about 0 mol % phenyltrimethoxysilane monomers.

In one embodiment, it is preferred that the polymer has a low carbon content. In this embodiment, the polymer comprises less than about 33% by weight carbon, preferably from about 18% to about 33% by weight carbon, more preferably from about 23% to about 33% by weight carbon, and even more preferably from about 23% to about 28% by weight carbon, where the carbon weight percent is calculated by the molecular weight of the carbon as a percentage of the molecular weight of the polymer.

In another embodiment, it is preferred that the polymer has a high silicon content. In this embodiment, the polymer comprises at least about 27% by weight silicon, preferably from about 27% to about 47% by weight silicon, more preferably from about 33% silicon to about 39% silicon, and even more preferably from about 35% silicon to about 38% silicon, where the silicon percent is calculated by the molecular weight of the silicon as a percentage of the molecular weight of the polymer.

Regardless of the embodiment, the weight-average molecular weight (Mw) range of the polymer is preferably from about 1,000 Daltons to about 5,000 Daltons, and more preferably from about 1,500 Daltons to about 3,000 Daltons, as determined by gel permeation chromatography (GPC) using polystyrene standards.

Finally, while numerous polymer embodiments have been set forth above, it will be appreciated that, unless directly contradictory to one another, the foregoing embodiments can be "mixed-and-matched" with one another.

2. Polymerization Materials and Methods

To synthesize the polymer, the monomers are charged to a reactor with a distillation apparatus or reflux setup in an appropriate polymerization solvent with stirring. Polymerization solvents may include, but are not limited to, propylene glycol monomethyl ether acetate ("PGMEA"), propylene glycol methyl ether ("PGME"), acetone, cyclohexanone, ethyl lactate, isopropanol, propanol, butanol, and mixtures thereof. Preferred monomer percent solids in the reaction mixture are from about 10% to about 25%, and more preferably from about 14% to about 20%. A catalyst is then slowly charged to the reactor at ambient temperature. Suitable catalysts include, but are not limited to, nitric acid, hydrochloric acid, acetic acid, trifluoroacetic acid, sulfonic acid, and combinations thereof. The catalyst is added in an amount of preferably 3 to 10 equivalents, and more preferably about 5 equivalents to the total monomers, where one equivalent is equal to one mole of water per mol of monomer, or 18 grams of water per mole of monomer. The reaction mixture is allowed to stir preferably from about 0 minutes to about 60 minutes, more preferably from about 1 minute to about 60 minutes, and even more preferably from about 10 minutes to about 30 minutes.

The solution is then heated to a temperature from about 60° C. to about 120° C., preferably from about 60° C. to about 95° C., and more preferably about 65° C. to about 75° C., preferably for a time period of about 2 hours to about 48 hours, more preferably from about 8 hours to about 24 hours, and even more preferably about 24 hours. During this heating step, the distillation setup is used to remove methanol generated during the polymerization reaction. A further rotovap or vacuum process may be needed to remove excess methanol/ethanol/water byproducts from the reaction. The rotovap or vacuum process could either be at ambient temperature or at heated temperatures from about 25° C. to about 60° C., and preferably below or about 40-50° C. The methanol/ethanol/water byproduct contents range from about 0% to about 10%, preferably below about 1%.

3. Composition Preparation

The polymer is then dispersed or dissolved in a solvent system, or the polymer mother liquor is further diluted to the desired solids level with solvent. Preferred solvent systems include a solvent selected from the group consisting of PGMEA, PGME, propylene glycol n-propyl ether ("PnP"), ethyl lactate, cyclohexanone, gamma-butyrolactone ("GBL"), methyl isobutyl carbinol, propylene glycol monoethyl ether ("PGEE"), water, ethanol, and mixtures thereof. The solvent system is preferably utilized at from about 90% to about 97% by weight, more preferably from about 92% to 94%, and even more preferably from about 92.5% to about 93% by weight, based upon the total weight of the composition taken as 100% by weight. The compositions used to form the silicon planarizing layers will preferably comprise a solids content of from about 3% to about 10% by weight solids, more preferably from about 6% to about 8% by weight solids, and even more preferably from about 7% to about 7.5% by weight solids, based upon the total weight of the composition taken as 100% by weight.

Mixing the above ingredients together in the solvent system forms the silicon planarizing layer composition. Furthermore, any optional ingredients (e.g., surfactants, mineral acids, organic acids, grafting/condensation catalysts, thermal acid generators ("TAGs"), and/or photoacid generators ("PAGs")) are also dispersed in the solvent system at the same time. When present, the optional ingredients (cumulatively or individually) should be present in the compositions at a level of from about 0.01% to about 2.0% by weight, and preferably from about 0.1% to about 1.0% by weight, based upon the total weight of the solids in the composition taken as 100% by weight.

In one embodiment, the planarizing composition consists essentially of, or even consists of the above-described polymer, one or more of the above optional ingredients, and solvent system. In a further embodiment, the planarizing composition consists essentially of, or even consists of, the above-described polymer and solvent system.

Methods of Using the Silicon Planarizing Compositions

In the inventive method, a planarizing composition as described above is formed into a layer on a substrate surface, or on an intermediate layer (e.g., silicon, silicon dioxide, silicon carbide, silicon nitride, silicon oxynitride, metals (including TiN and/or tungsten), carbon (including carbon fiber, carbon nanofibers, carbon nanotubes, diamond, and/or graphene), fluorocarbons, filaments, and high-k dielectrics) present on the substrate surface. Any microelectronic substrate can be utilized. The substrate is preferably a semiconductor substrate, such as silicon, SiGe, $SiO_2$, $Si_3N_4$, SiON, SiCO:H (such as that sold under the name Black Diamond), aluminum, tungsten, tungsten silicide, gallium arsenide, germanium, tantalum, tantalum nitride, $Ti_3N_4$, hafnium, $HfO_2$, ruthenium, indium phosphide, glass, or mixtures of the foregoing. The substrate or its intermediate layers include topographic features (via holes, trenches, contact holes, raised features, lines, etc.). As used herein, "topography" refers to the height or depth of a structure in or on a substrate surface.

The inventive silicon planarizing layer is then applied to the substrate or any intermediate layers. It will be appreciated that any intermediate layers applied to a substrate having topography will necessarily have topography similar to that of the substrate's surface. Thus, regardless of whether the planarizing layer is applied to the substrate surface or to an intermediate layer, it will be used to fill gaps in the topography in a void-free (i.e., bubble-free) manner while also creating a substantially planar surface for use in subsequent processing steps. It can be determined whether the layers are void-free by examining a cross-section of the planarizing layer under a scanning electron microscope and visually verifying that no voids are present.

The silicon planarizing layer is preferably applied by spin-coating at speeds from about 1,000 rpm to about 5,000 rpm, preferably from about 1,250 rpm to about 1,750 rpm, for a time period of from about 30 seconds to about 120 seconds, preferably from about 45 seconds to about 75 seconds. After the silicon planarizing layer is applied, it is preferably heated to a temperature from about 100° C. to about 400° C., and more preferably from about 150° C. to about 250° C., for a time period of from about 30 seconds to about 120 seconds, and preferably from about 45 seconds to about 60 seconds, to evaporate solvents and crosslink the material, preferably by a sol-gel reaction. The thickness (average measurements taken over five locations by an ellipsometer) of the silicon planarizing layer after baking is preferably from about 80 nm to about 300 nm, more preferably from about 150 nm to about 250 nm, and even more preferably from about 180 nm to about 220 nm.

The planarizing layer prepared according to the described methods will have low biases. Specifically, the inventive methods will result in profiles having biases with absolute values (i.e., could be a positive or a negative bias) of less than about 60 nm, preferably less than about 40 nm, and more preferably from about 10 nm to about 30 nm, even at average film thicknesses of less than about 80 nm.

When determining bias, the thickness of a layer is determined by measuring (with an ellipsometer, SEM, or other conventional device) the thickness of that layer at a point about halfway between two via holes that are not separated from one another by an intervening feature and whose boundaries are within about 1,000 nm of one another. These measurements are repeated over a wafer (or other area as defined herein) up to 49 times, and the measurements are averaged to determine the average thickness of a layer. The bias is determined by subtracting the average thickness of a layer over a dense region from the average thickness of that same layer over an isolated region, as measured by SEM. A dense region is defined as a portion of a substrate that has at least about 50% of its surface area filled with via holes or a 1:1 line to space ratio, while an isolated region is defined as a portion of a substrate that has less than about 20% of its surface area filled with via holes or a 1:5 line to space ratio.

The silicon planarizing layer will have a high silicon content, that is, the layer is preferably from about 36% silicon to about 42% silicon, and more preferably from about 38% to about 41% silicon, based upon the total weight of the cured planarizing layer taken as 100% by weight. The silicon planarizing layer will have low carbon content, that is, the layer is preferably from about 15% carbon to about 30% carbon, and more preferably from about 15% carbon to about 20% carbon, based upon the total weight of the cured planarizing layer taken as 100% by weight.

The silicon planarizing layer will preferably have an n value of from about 1.40 to about 1.50, and more preferably from about 1.42 to about 1.46. The silicon planarizing layer will preferably have a k value of less than about 0.10, more preferably from about 0 to about 0.10, and even more preferably from about 0 to about 0.05.

Next, an optional carbon-rich layer or a hardmask layer is formed on top of the silicon planarizing layer, depending on the particular application. In embodiments where a carbon-rich layer is formed on top of the silicon planarizing layer, that carbon-rich layer can be formed by any known application method, with one preferred method being spin-coating at speeds from about 1,000 to about 5,000 rpm, preferably from about 1,250 to about 1,750 rpm, for a time period of from about 30 to about 120 seconds, preferably from about 45 to 75 seconds. The carbon-rich layer can also be formed by other known application methods, such as chemical vapor deposition (CVD), plasma-enhanced chemical vapor deposition (PECVD), atomic layer deposition (ALD), or plasma-enhanced atomic layer deposition (PEALD).

The term "carbon-rich" refers to layers formed from compositions comprising greater than about 50% by weight carbon, preferably greater than about 70% by weight carbon, and more preferably from about 75 to about 80% by weight carbon, based upon the total solids in the composition taken as 100% by weight. Suitable carbon-rich layers are selected from the group consisting of spin-on carbon layers (SOC), amorphous carbon layers, and carbon planarizing layers. Exemplary carbon-rich layers will generally compromise a polymer dissolved or dispersed in a solvent system, along with the following optional ingredients: acid and/or base quenchers, catalysts, crosslinking agents, and/or surface modification additives. Preferred compositions for use as a carbon-rich layer will be suitable for forming thick layers and preferably have solids content of from about 0.1% to about 70% by weight, more preferably from about 5% to about 40% by weight, and even more preferably from about 10% to about 30% by weight, based upon the total weight of the carbon-rich composition taken as 100% by weight.

After the carbon-rich composition is applied, it is preferably heated to a temperature from about 100° C. to about 400° C., and more preferably from about 160° C. to about 350° C., and for a time period of from about 30 seconds to about 120 seconds, preferably from about 45 seconds to about 60 seconds, to evaporate solvents. The thickness of the carbon-rich layer after baking is preferably from about 10 nm to about 120 nm, more preferably from about 20 nm to about 100 nm, and even more preferably from about 50 nm to about 60 nm.

In embodiments where a hardmask layer is formed on top of the silicon planarizing layer, a conventional silicon hardmask layer can be formed by any known application method, with one preferred method being spin-coating at speeds of about 1,000 to about 5,000 rpm, and preferably from about 1,250 to about 1,750 rpm, for a time period of from about 30 to about 120 seconds, preferably from about 45 to about 75 seconds. Suitable hardmask layers are preferably high-silicon-content materials selected from the group consisting of silanes, siloxanes, silsesquioxanes, and mixtures thereof, and preferably chemically different from the planarizing layers described herein. Exemplary hardmask layers will generally comprise a polymer dissolved or dispersed in a solvent system, along with the following optional ingredients: surfactants, acid catalysts, base catalysts, and/or cross-linkers. Preferred hardmask compositions will preferably have solids content of from about 0.1% to about 70% by weight, more preferably from about 0.5% to about 10% by weight, and even more preferably from about 1% to about 2% by weight, based upon the total weight of the composition taken as 100% by weight. After the hardmask is applied, it is preferably heated to a temperature from about 100° C. to about 300° C., and more preferably from about 150° C. to about 250° C. and for a time period of from about 30 seconds to about 120 seconds, preferably from about 45 seconds to about 60 seconds, to evaporate solvents. The thickness of the hardmask layer after baking is preferably from about 5 nm to about 50,000 nm, more preferably from about 5 nm to about 1,000 nm, and even more preferably from about 10 nm to about 100 nm. When both a hardmask layer and carbon-rich layer are used, the hardmask layer should have an etch rate that is at least about 0.75 times that of any carbon-rich layer in a fluorine-rich plasma atmosphere and at least 5 times slower than the carbon-rich layer in an oxygen-rich plasma etch atmosphere.

Some commercial hardmask layers can be used. Other preferred hardmask layers contain a copolymer of monomers selected from the group consisting of phenethyltrimethoxysilane (PETMS), 2-(carbomethoxy)ethyltrimethoxysilane (CMETMS), tetraethoxysilane (TEOS), methyltrimethoxysilane, phenyltrimethoxysilane, and combinations thereof.

In other embodiments, a carbon-rich layer can be formed on the silicon planarizing layer and a hardmask layer formed on the carbon-rich layer. In another embodiment, a hardmask layer can be formed on the silicon planarizing layer, and a carbon-rich layer formed on top of the hardmask layer. Alternatively, only one of the carbon-rich layer or hardmask layer is formed on the planarizing layer, as discussed above.

In a further embodiment, an antireflective coating may be formed on whichever of the silicon planarizing layer, carbon-rich layer, or hardmask layer is the uppermost (i.e., whichever was the last layer to be formed). Preferred antireflective coatings are those having a k value of at least about 0.2, more preferably from about 0.2 to about 0.9, and even more preferably from about 0.25 to about 0.7. In one embodiment, that antireflective coating has a relatively low silicon content. That is, the silicon content of the antireflective layer is less than about 20% by weight, preferably less than about 10% by weight, more preferably less than about 5% by weight, and even more preferably about 0% by weight, based on the total weight of the antireflective layer taken as 100% by weight.

Regardless of the layer configuration, once the uppermost layer (be it a carbon-rich layer, hardmask layer, or antireflective) on top of the planarizing layer is cured, a photoresist (i.e., imaging layer) can be applied to that uppermost layer to form a photoresist layer, or the photoresist may be applied to directly to the silicon planarizing layer. The photoresist layer can be formed by any conventional method, with one preferred method being spin coating the photoresist composition at speeds of from about 350 rpm to about 4,000 rpm (preferably from about 1,000 rpm to about 2,500 rpm) for a time period of from about 10 seconds to about 60 seconds (preferably from about 10 seconds to about 30 seconds). The photoresist layer is then optionally post-application baked ("PAB") at a temperature of at least about 70° C., preferably from about 80° C. to about 150° C., and more preferably from about 100° C. to about 150° C., and for time periods of from about 30 seconds to about 120 seconds. The thickness of the photoresist layer after baking will typically be from about 5 nm to about 120 nm, preferably from about 10 nm to about 50 nm, and more preferably from about 20 nm to about 40 nm.

The photoresist layer is subsequently patterned by exposure to radiation for a dose of from about 20 mJ/cm$^2$ to about 45 mJ/cm$^2$, preferably from about 25 mJ/cm$^2$ to about 40 mJ/cm$^2$, and more preferably from about 30 mJ/cm$^2$ to about 35 mJ/cm$^2$. More specifically, the photoresist layer is exposed using a mask positioned above the surface of the photoresist layer. The mask has areas designed to permit the radiation to pass through the mask and contact the surface of the photoresist layer. The remaining portions of the mask are designed to absorb the light to prevent the radiation from contacting the surface of the photoresist layer in certain areas. Those skilled in the art will readily understand that the arrangement of absorbing portions is designed based upon the desired pattern to be formed in the photoresist layer and ultimately in the substrate or any intermediate layers.

After exposure, the photoresist layer is subjected to a post-exposure bake ("PEB") at a temperature of less than about 180° C., preferably from about 60° C. to about 140° C., and more preferably from about 80° C. to about 130° C., for a time period of from about 30 seconds to about 120 seconds (preferably from about 30 seconds to about 90 seconds).

The photoresist layer is then contacted with a developer to form the pattern. Depending upon whether the photoresist used is positive-working or negative-working, the developer will either remove the exposed portions of the photoresist layer or remove the unexposed portions of the photoresist layer to form the pattern. The pattern is then transferred to the hardmask, carbon-rich layers, and/or antireflective layers (depending on which is present and in what order), to the planarizing layer, and finally to the substrate. This pattern transfer can take place via plasma etching (e.g., CF$_4$ etchant, O$_2$ etchant) or a wet etching or developing process, depending on the particular layer, process being followed, and/or user preference. Advantageously, one of the properties of the silicon planarizing layers is that they are wet developable or wet etchable, which means they can be removed by wet etching, either during the pattern transfer process, or upon the completion of the pattern transfer process. Preferred wet etching or developing materials include, but are not limited to, SC1 (a commercial developer that is 1:1:5 volume mixture of NH$_4$OH:H$_2$O$_2$:H$_2$O mixture), tetramethylammonium hydroxide ("TMAH"), and/or dilute HF. Preferably, the wet etch or development rate of the planarizing layer in SC1 is at least about 20 nm/minute, preferably from about 20 nm/minute to about 200 nm/minute, and more preferably from about 40 nm/minute to about 100 nm/minute.

Additionally, another of the properties of the planarizing layers is that they are resistant to oxygen etching. That is, the planarizing layers formed as described herein will experience less than about 5%, preferably less than about 2%, more preferably less than about 1%, and even more preferably about 0% thickness loss after about 2 minutes of oxygen etch.

Regardless of whether pattern transfer is effected by etching or by developing, the resulting features have high resolutions. For example, resolutions of less than about 40 nm half pitch, and preferably less than about 30 nm half pitch, can be achieved with the inventive method.

Additional advantages of the various embodiments will be apparent to those skilled in the art upon review of the disclosure herein and the working examples below. It will be appreciated that the various embodiments described herein are not necessarily mutually exclusive unless otherwise indicated herein. For example, a feature described or depicted in one embodiment may also be included in other embodiments but is not necessarily included. Thus, the present disclosure encompasses a variety of combinations and/or integrations of the specific embodiments described herein.

As used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone; B alone; C alone; A and B in combination; A and C in combination; B and C in combination; or A, B, and C in combination.

The present description also uses numerical ranges to quantify certain parameters relating to various embodiments. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth methods in accordance with the disclosure. It is to be understood, however, that these examples are provided by way of illustration and nothing therein should be taken as a limitation upon the overall scope of the invention.

Example 1

Synthesis and Formulation of Silicon Planarization Material 1

A 3-necked round-bottom flask was equipped with a thermocouple, a magnetic stir bar, an N$_2$ feed line, a bubbler, a condenser, and a heating oil bath. Next, 3.41 grams (11.2 mmol) of TEOSPSA (Gelest, Morrisville, PA, USA), 1.38 grams (5.6 mmol) of ECHETMS (Gelest, Morrisville, PA, USA), 24.79 grams (182 mmol) of MTMS (Gelest, Morrisville, PA, USA), and 16.92 grams (81.2 mmol) of TEOS (Gelest, Morrisville, PA, USA) were measured by weight and charged into the reactor with 80 grams (605 mmol) of PGMEA as a solvent (KMG Electronic Chemicals, Fort Worth, TX). Then, 25.2 grams of 0.01M HNO$_3$ (Fisher Scientific, Ontario, Canada) was slowly charged to the reactor as a catalyst at ambient temperature. A two-phase mixture was obtained after addition. The batch was stirred at ambient temperature for 30 minutes. A mild exothermic effect was observed (batch temperature increased from 20° C. to about 25-28° C. The oil bath temperature was then adjusted to 70° C. to initiate distillation. The batch was stirred at 65° C. (internal solution temperature) for 24 hours to achieve molecular weight of 2,500 Daltons. The batch temperature was cooled down to ambient temperature. The polymer made was further diluted with a 50:50 (by volume) mixture of PGME and PGMEA to 7 wt. % solids.

Example 2

Formulation of Silicon Planarization Material 2

In this Example, 100 grams of the material prepared in Example 1 was added to a 250-mL round-bottom flask, and 100 grams of PGMEA also was added into the same round-bottom flask. The round-bottom flask then was connected to a rotary evaporator device (Buchi Rotovap R124). A vacuum was applied (6 torr) while the polymer solution was heated at 50° C. in a water bath. After 30 min, the material was removed from the rotary evaporator, and PGMEA was added to account for the loss of the solvents. After this process, the methanol/ethanol/water byproduct content level was below 1%. The molecular weight of the polymer had minimally increased (less than 500 Da). The polymer made was further diluted with a 50:50 (by volume) mixture of PGEE and PGMEA to 7.7 wt. % solids.

Example 3

Formulation of Silicon Planarization Material 3

A 3-necked round-bottom flask was equipped with a thermocouple, a magnetic stir bar, an $N_2$ feed line, a bubbler, a condenser, and a heating oil bath. Next, 2.44 grams of TEOSPSA, 0.99 gram of ECHETMS, 17.71 grams of MTMS, and 12.08 grams of TEOS were measured by weight and charged into the reactor with 55 grams of PGMEA as a solvent. Then, 14.44 grams of 3N acetic acid in water (VWR, Batavia, IL) was slowly charged to the reactor as a catalyst at ambient temperature over 30 minutes. The batch was stirred at ambient temperature for 10 minutes after which the oil bath temperature was adjusted to 91° C. The batch was stirred for 5 hours to achieve molecular weight of 3,000 Daltons. The batch temperature was cooled to ambient temperature. The polymer made was further diluted down a 70:30 mixture (by volume) of PGMEA and PGME to 3 wt. % solids.

Example 4

Formulation of Silicon Planarization Material 4

A 3-necked round-bottom flask was equipped with a thermocouple, a magnetic stir bar, an $N_2$ feed line, a bubbler, a condenser, and a heating oil bath. 3.41 grams of TEOSPSA, 25.55 grams of MTMS, and 16.92 grams of TEOS were charged into the reactor with 80 grams of PGMEA as a solvent. Next, 25.20 grams of 0.01M $HNO_3$ was slowly charged to the reactor as a catalyst at ambient temperature over 30 minutes. The batch was stirred at ambient temperature for 10 minutes after which the oil bath temperature was adjusted to 70° C. The batch was then stirred for 10 hours to achieve a molecular weight of 2,000 Daltons. The batch temperature was cooled down to ambient temperature. The polymer made was further diluted with PGME to 7 wt. % solids.

Example 5

Formulation of Silicon Planarization Material 5

A 3-necked round-bottom flask was equipped with a thermocouple, a magnetic stir bar, an $N_2$ feed line, a bubbler, a condenser, and a heating oil bath. Next, 3.41 grams of TEOSPSA, 25.55 grams of MTMS, and 16.92 grams of TEOS were charged into the reactor with 40 grams of PGMEA as a solvent, after which 20.16 grams of 0.01M $HNO_3$ was slowly charged to the reactor as a catalyst at ambient temperature over 30 minutes. The batch was stirred at ambient temperature for 10 minutes, and the oil bath temperature was then adjusted to 70° C. The batch was stirred for 8 hours to achieve molecular weight of 2,000 Daltons. The batch temperature was cooled down to ambient temperature. The polymer made was further diluted with PGME to 7 wt. % solids.

Example 6

Formulation of Silicon Planarization Material 6

A 3-necked round-bottom flask was equipped with a thermocouple, a magnetic stir bar, an $N_2$ feed line, a bubbler, a condenser, and a heating oil bath. Next, 6.82 grams of TEOSPSA, 1.38 grams of ECHTMS, 30.45 grams of MTEOS, and 16.92 grams of TEOS were charged into the reactor with 40 grams of PGMEA as a solvent, after which 20.16 grams of 0.01M $HNO_3$ was slowly charged to the reactor as a catalyst at ambient temperature over 30 minutes. The batch was stirred at ambient temperature for 10 minutes, and the oil bath temperature was then adjusted to 70° C. The batch was stirred for 8 hours to achieve a molecular weight of 2,000 Daltons. The batch temperature was cooled to ambient temperature. The polymer made was further diluted down with PGME to 7 wt. % solids.

Example 7

Formulation of Silicon Planarization Material 7

A 3-necked round-bottom flask was equipped with a thermocouple, a magnetic stir bar, an $N_2$ feed line, a bubbler, a condenser, and a heating oil bath. Next, 2.44 grams of TEOSPSA, 0.99 gram of ECHETMS, 12.8 grams of MTMS, and 19.58 grams of TEOS were charged into the reactor with 55.00 grams of PGMEA as a solvent, after which 15.31 grams of 3N acetic acid in water was slowly charged to the reactor as a catalyst at ambient temperature over 30 minutes. The batch was stirred at ambient temperature for 10 minutes, and the oil bath temperature was adjusted to 83° C. The batch was stirred for 2 hours to achieve molecular weight of 3,000 Daltons. The batch temperature was cooled to ambient temperature. The polymer made was further diluted down with a 70:30 mixture (by volume) of PGMEA and PGME to 3 wt. % solids.

Example 8

Spin Coating and Silicon Content of Formulations

The material from Example 2 was spin-coated onto a silicon wafer at a spin speed of 1,500 rpm for 60 seconds and then baked on a hot plate at 205° C. for 60 seconds to form a crosslinked film with a thickness of approximately 1,900 Å and a silicon content of approximately 38.7%. The materials from Examples 3 and 7 were each spin-coated onto individual silicon wafers at a spin speed of 1,500 rpm for 60 seconds and then baked on a hot plate at 205° C. for 60 seconds to form a crosslinked film with a thickness of approximately 800 Å and a silicon content of approximately 38.7% (Example 3 formulation) and 39.5% (Example 7 formulation).

Example 9

Spin Coating and Silicon Content of Formulations

Figure 2:
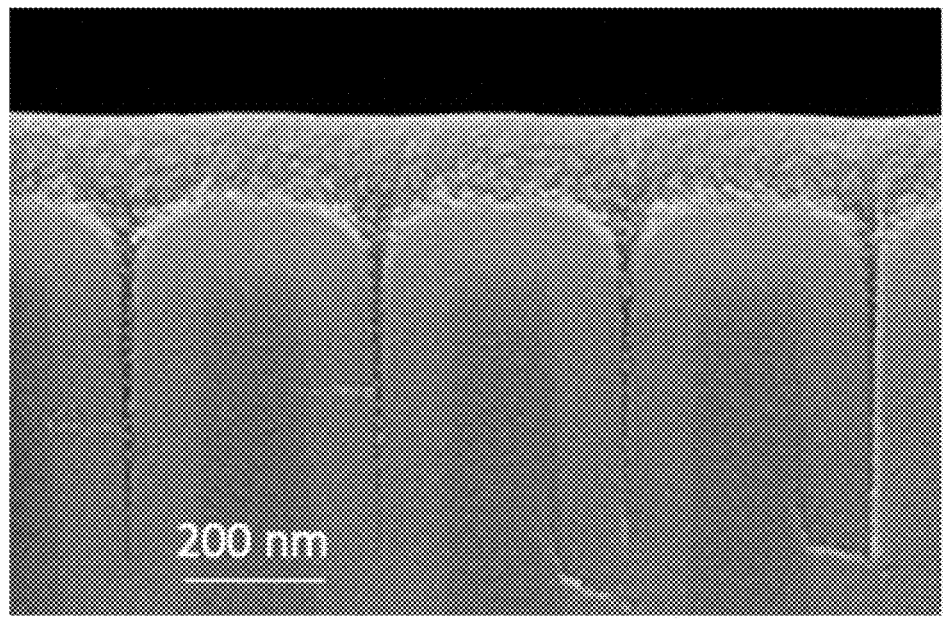
FIG. 2 is a SEM cross-section of the planarization performance over dense features of the Example 1 formulation when formed into a layer as described in Example 9.
Figure 3:
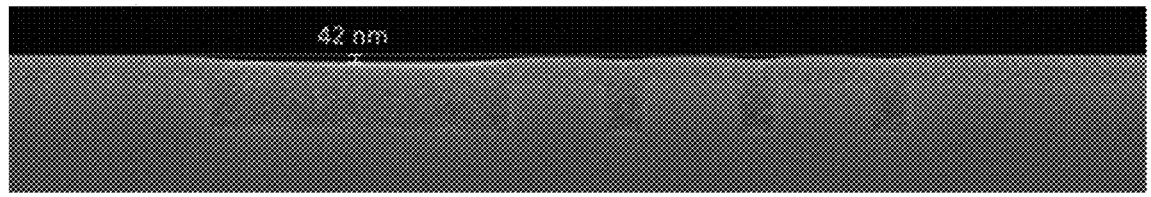
FIG. 3 is a SEM cross-section of the planarization performance over dense and isolated features of the Example 1 formulation when formed into a layer as described in Example 9.

The material from Example 1 was spin-coated onto a silicon wafer with topography at a spin speed of 1,500 rpm for 60 seconds and then baked on a hot plate at 205° C. for 60 seconds to form a crosslinked film. Cross-sectional images were taken to reveal the gap fill and planarization performance. FIGS. 1-3 show the planarization and gap fill performance of the material over dense and isolated features.

Example 10

Wet Removability Testing

The materials from Examples 1, 3, and 7 were spin-coated onto silicon wafers at a spin speed of 1,500 rpm for 60 seconds and then baked on a hot plate at 205° C. for 60 seconds to form crosslinked films. The coated wafers were then submerged in an aqueous 5% TMAH solution for 1 minute at 40° C., or in SC1 solution (a developer, which is a 1:1:5 volume mixture of $NH_4OH:H_2O_2:H_2O$ mixture) for 3 minutes at 60° C. The wafers were then rinsed with DI water and dried under nitrogen. The film thicknesses were measured before and after this wet cleaning step by ellipsometry, and the differences are reported as percentage loss in Table 1. These results indicate that the film has good wet cleanability.

TABLE 1

| | Film loss | | |
|---|---|---|---|
| | Example 1 | Example 3 | Example 7 |
| 5% TMAH | >99% | >99% | >99% |
| SC1 | >99% | >99% | >99% |

Example 11

Processing Example

Figure 4:
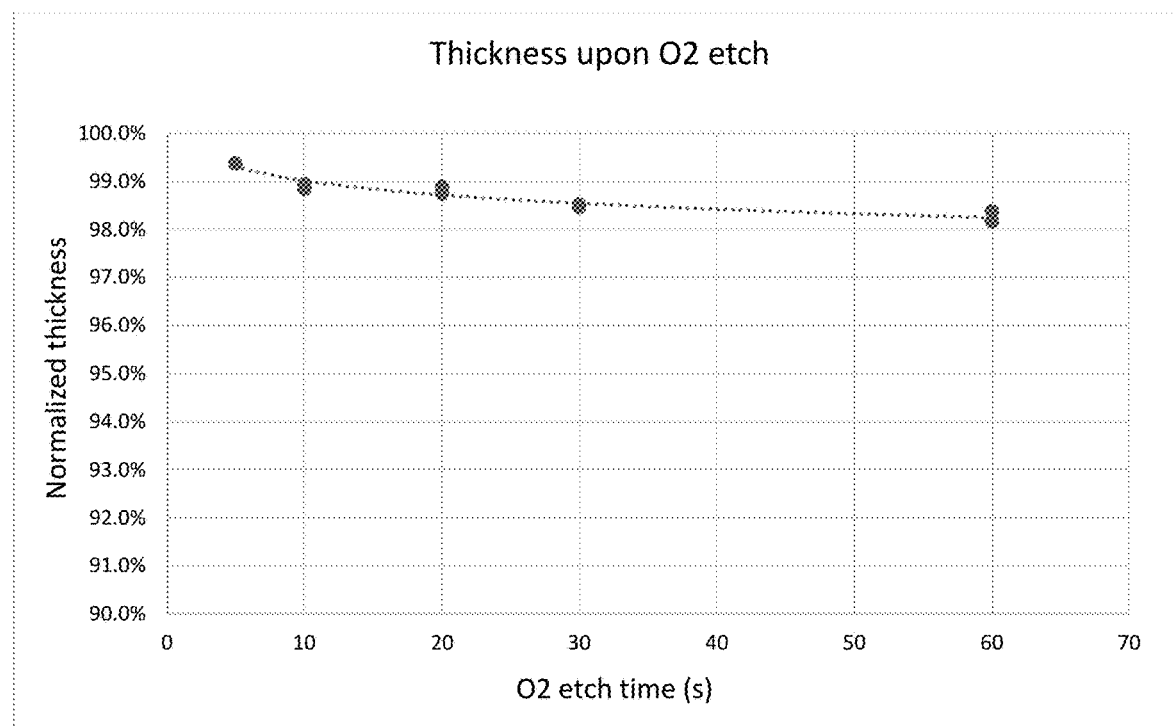
FIG. 4 is a graph showing the thickness change over time when subjected to 02 etching (Example 11).

A film of the material from Example 1 was coated onto silicon wafers by spin coating at 1,500 rpm for 60 seconds, and the film was cured at 205° C. for 1 minute to form a crosslinked network structure with a film thickness of approximately 190 nm. The film was then subjected to an oxygen plasma etch for 5 seconds, 10 seconds, 20 seconds, 30 seconds, and 60 seconds. The film thickness was measured before and after this etch step using an ellipsometer to calculate the etching rate. The data suggest the film had good oxygen etching resistance. FIG. 4 shows these results.

We claim:
1. A method of forming a structure, said method comprising:
providing a substrate comprising a surface comprising topographic features, said substrate optionally including one or more intermediate layers on said substrate surface;
applying a composition to said substrate surface, or on said one or more intermediate layers, if present, so as to form a planarizing layer, said composition comprising a polymer comprising [3-(triethoxysilyl)propyl] succinic anhydride monomers; and
performing (I), (II), (III), (IV), or (V):
(I) forming a silicon hardmask layer on said planarizing layer;
optionally forming an antireflective layer on said silicon hardmask layer; and
forming a photoresist layer on said silicon hardmask layer, or on said antireflective layer, if present;
(II) forming a silicon hardmask layer on said planarizing layer;
forming a carbon-rich layer on said silicon hardmask layer;
optionally forming an antireflective layer on said carbon-rich layer; and
forming a photoresist layer on said carbon-rich layer, or on said antireflective layer, if present;
(III) forming a carbon-rich layer on said planarizing layer;
optionally forming an antireflective layer on said carbon-rich layer; and
forming a photoresist layer on said carbon-rich layer, or on said antireflective layer, if present;
(IV) forming a carbon-rich layer on said planarizing layer;
forming a silicon hardmask layer on said carbon-rich layer;
optionally forming an antireflective layer on said silicon hardmask layer; and
forming a photoresist layer on said silicon hardmask layer, or on said antireflective layer, if present; or
(V) forming an antireflective layer on said planarizing layer; and
forming a photoresist layer on said antireflective layer.

2. The method of claim 1, wherein said polymer further comprises a monomer chosen from:

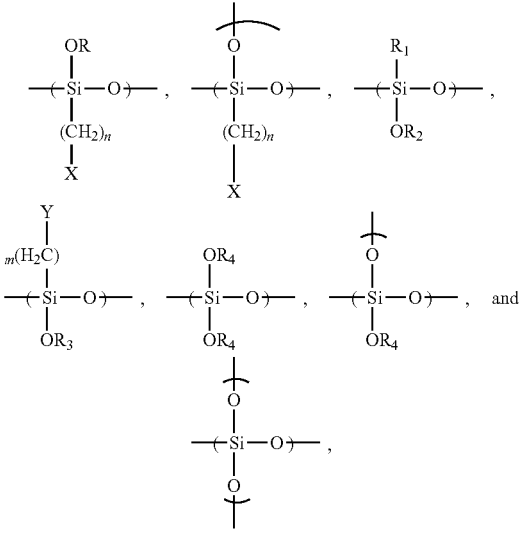

where:
each R is individually chosen from $C_1$ to about $C_6$ alkyls and hydrogen;
each $R_1$ is individually chosen from $C_1$ to about $C_6$ alkyls and from $C_6$ to about $C_{20}$ aryls;

each $R_2$ is individually chosen from $C_1$ to about $C_6$ alkyls and hydrogen;

each $R_3$ is individually chosen from $C_1$ to about $C_6$ alkyls and hydrogen;

each $R_4$ is individually chosen from $C_1$ to about $C_6$ alkyls and hydrogen;

m is 1 to about 6;

n is 1 to about 6;

each X is individually chosen from glycidoxy, epoxy, epoxycycloalkyls, acetamido, and isocyanurate moieties; and each Y is individually chosen from acetoxy, ester, and aryl moieties.

3. The method of claim 2, wherein said polymer further comprises a monomer chosen from (3-glycidoxypropyl)trimethoxysilane, 5,6-epoxyhexyl-triethoxysilane, 2-(3,4-epoxycyclohexyl)-ethyltrimethyoxysilane, (3-acetamidopropyl)-trimethoxysilane, (1,3-Di-2-propen-1-yl)-5-(([3-triethoxysilylpropyl])-(1,3,5-triazine-2,4,6 (1H, 3H, 5H)-trione), methyltrimethoxysilane, methyltriethoxysilane, dimethyldimethoxysilane, dimethyldiethoxy-silane, phenyltrimethoxysilane, phenethyl-trimethoxysilane, 2-(carbomethoxy)ethyltrimethoxy-silane, acetoxyethyltrimethoxysilane, ethyl-trimethoxysilane, n-butyltrimethoxysilane, tetraethoxysilane, tetramethyl orthosilicate, and mixtures thereof.

4. The method of claim 1, said polymer further comprising a monomer chosen from 2-(3,4-epoxycyclohexyl)-ethyltrimethyoxysilane, methyltriethoxysilane, methyltrimethoxysilane, tetraethoxysilane, and mixtures thereof.

5. The method of claim 4, said polymer comprising at least two of 2-(3,4-epoxycyclohexyl)-ethyltrimethyoxysilane, methyltriethoxysilane, methyltrimethoxysilane, or tetraethoxysilane.

6. The method of claim 1, wherein said polymer comprises from about 1 mol % to about 10 mol % [3-(triethoxysilyl)propyl]succinic anhydride monomers.

7. The method of claim 1, wherein said planarizing layer comprises less than about 33% by weight carbon, based on the weight of the planarizing layer taking as 100% by weight.

8. The method of claim 1, wherein said planarizing layer has a k value of less than about 0.10.

9. The method of claim 1, wherein said polymer comprises less than about 10 mol % phenyltrimethoxysilane.

10. The method of claim 1, wherein said polymer comprises less than about 45 mol % tetraethoxysilane.

11. The method of claim 1, wherein said substrate is selected from the group consisting of silicon, SiGe, $SiO_2$, $Si_3N_4$, SiON, SiCO:H, aluminum, tungsten, tungsten silicide, gallium arsenide, germanium, tantalum, tantalum nitride, $Ti_3N_4$, hafnium, $HfO_2$, ruthenium, indium phosphide, glass, and mixtures of the foregoing.

12. The method of claim 1, wherein said planarizing layer has a bias with an absolute value that is less than about 60 nm.

13. The method of claim 1, further comprising:
exposing said photoresist layer to radiation so as to form a pattern in said photoresist layer; and
transferring said pattern to any antireflective layer, silicon hardmask layer, or carbon-rich layer that is present; to said planarizing layer; to any intermediate layer that is present; and to said substrate.

14. The method of claim 13, wherein said transferring said pattern comprises contacting said photoresist layer with a developer.

15. A structure comprising:
a substrate comprising a surface comprising topographic features, said substrate optionally including one or more intermediate layers on said substrate surface;
a planarizing layer on said substrate surface or on said one or more intermediate layers, if present, said planarizing layer comprising a polymer comprising [3-(triethoxysilyl)propyl]succinic anhydride monomers; and
one of (I), (II), (III), (IV), or (V):
(I) a silicon hardmask layer on said planarizing layer;
optionally an antireflective layer on said silicon hardmask layer; and
a photoresist layer on said silicon hardmask layer, or on said antireflective layer, if present;
(II) a silicon hardmask layer on said planarizing layer;
a carbon-rich layer on said silicon hardmask layer;
optionally an antireflective layer on said carbon-rich layer; and
a photoresist layer on said carbon-rich layer, or on said antireflective layer, if present;
(III) a carbon-rich layer on said planarizing layer;
optionally an antireflective layer on said carbon-rich layer; and
a photoresist layer on said carbon-rich layer, or on said antireflective layer, if present;
(IV) a carbon-rich layer on said planarizing layer;
a silicon hardmask layer on said carbon-rich layer;
optionally an antireflective layer on said silicon hardmask layer; and
a photoresist layer on said silicon hardmask layer, or on said antireflective layer, if present; or
(V) an antireflective layer on said planarizing layer; and
a photoresist layer on said antireflective layer.

16. The structure of claim 15, wherein said substrate is selected from the group consisting of silicon, SiGe, $SiO_2$, $Si_3N_4$, SiON, SiCO:H, aluminum, tungsten, tungsten silicide, gallium arsenide, germanium, tantalum, tantalum nitride, $Ti_3N_4$, hafnium, $HfO_2$, ruthenium, indium phosphide, glass, and mixtures of the foregoing.

17. The structure of claim 15, wherein said polymer further comprises a monomer chosen from (3-glycidoxypropyl)trimethoxysilane, 5,6-epoxyhexyl-triethoxysilane, 2-(3,4-epoxycyclohexyl)-ethyltrimethyoxysilane, (3-acetamidopropyl)-trimethoxysilane, (1,3-Di-2-propen-1-yl)-5-(([3-triethoxysilylpropyl])-(1,3,5-triazine-2,4,6 (1H, 3H, 5H)-trione), methyltrimethoxysilane, methyltriethoxysilane, dimethyldimethoxysilane, dimethyldiethoxy-silane, phenyltrimethoxysilane, phenethyl-trimethoxysilane, 2-(carbomethoxy)ethyltrimethoxy-silane, acetoxyethyltrimethoxysilane, ethyl-trimethoxysilane, n-butyltrimethoxysilane, tetraethoxysilane, tetramethyl orthosilicate, and mixtures thereof.

18. The structure of claim 15, said polymer further comprising a monomer chosen from 2-(3,4-epoxycyclohexyl)-ethyltrimethyoxysilane, methyltriethoxysilane, methyltrimethoxysilane, tetraethoxysilane, and mixtures thereof.

19. The structure of claim 18, said polymer comprising at least two of 2-(3,4-epoxycyclohexyl)-ethyltrimethyoxysilane, methyltriethoxysilane, methyltrimethoxysilane, or tetraethoxysilane.

20. The structure of claim 15, wherein said planarizing layer comprises less than about 33% by weight carbon, based on the weight of the planarizing layer taking as 100% by weight.

21. The structure of claim 15, wherein said planarizing layer has a k value of less than about 0.10.

22. The structure of claim 15, wherein said planarizing layer has a bias with an absolute value that is less than about 60 nm.

23. A method of forming a structure, said method comprising:
providing a substrate comprising a surface comprising topographic features, said substrate optionally including one or more intermediate layers on said substrate surface;
applying a composition to said substrate surface, or on said one or more intermediate layers, if present, so as to form a planarizing layer, said composition comprising a polymer comprising about 1 mol % to about 10 mol % [3-(triethoxysilyl)propyl]succinic anhydride monomers, wherein said planarizing layer is resistant to oxygen etching so that said planarizing layer would experience less than about 5% thickness loss if exposed to oxygen etching for about 2 minutes; and
forming a photoresist layer on said planarizing layer.

24. The method of claim 23, wherein said planarizing layer has an etch rate of at least about 20 nm/minute in a 1:1:5 volume mixture of $NH_4OH:H_2O_2:H_2O$.

25. The method of claim 23, wherein said planarizing layer comprises less than about 33% by weight carbon, based on the weight of the planarizing layer taking as 100% by weight.

26. The method of claim 23, wherein said planarizing layer has a k value of less than about 0.10.

27. The method of claim 23, wherein said polymer comprises less than about 45 mol % tetraethoxysilane.

28. The method of claim 23, wherein said polymer further comprises:
(i) about 1 mol % to about 5 mol % 2-(3,4-epoxycyclohexyl)-ethyltrimethyoxysilane;
(ii) about 35 mol % to about 85 mol % methyltrimethoxysilane;
(iii) about 15 mol % to about 60 mol % tetraethoxysilane;
(iv) about 35 mol % to about 85 mol % methyltrimethoxysilane and about 15 mol % to about 60 mol % tetraethoxysilane;
(v) about 35 mol % to about 85 mol % methyltrimethoxysilane, about 15 mol % to about 60 mol % tetraethoxysilane, and about 1 mol % to about 5 mol % 2-(3,4-epoxycyclohexyl)-ethyltrimethyoxysilane; or
(vi) about 15 mol % to about 60 mol % tetraethoxysilane, about 1 mol % to about 5 mol % 2-(3,4-epoxycyclohexyl)-ethyltrimethyoxysilane; and about 15 mol % to about 70 mol % methyltriethoxysilane.

29. A structure comprising:
a substrate comprising a surface comprising topographic features, said substrate optionally including one or more intermediate layers on said substrate surface;
a planarizing layer on said substrate surface or on said one or more intermediate layers, if present, said planarizing layer comprising a polymer comprising about 1 mol % to about 10 mol % [3-(triethoxysilyl)propyl]succinic anhydride monomers, wherein said planarizing layer is resistant to oxygen etching so that said planarizing layer would experience less than about 5% thickness loss if exposed to oxygen etching for about 2 minutes; and
a photoresist layer on said planarizing layer.

30. The structure of claim 29, wherein said planarizing layer has an etch rate of at least about 20 nm/minute in a 1:1:5 volume mixture of $NH_4OH:H_2O_2:H_2O$.

31. The structure of claim 29, wherein said planarizing layer comprises less than about 33% by weight carbon, based on the weight of the planarizing layer taking as 100% by weight.

32. The structure of claim 29, wherein said planarizing layer has a k value of less than about 0.10.

33. The structure of claim 29, wherein said polymer comprises less than about 45 mol % tetraethoxysilane.

34. The structure of claim 29, wherein said polymer further comprises:
(i) about 1 mol % to about 5 mol % 2-(3,4-epoxycyclohexyl)-ethyltrimethyoxysilane;
(ii) about 35 mol % to about 85 mol % methyltrimethoxysilane;
(iii) about 15 mol % to about 60 mol % tetraethoxysilane;
(iv) about 35 mol % to about 85 mol % methyltrimethoxysilane and about 15 mol % to about 60 mol % tetraethoxysilane;
(v) about 35 mol % to about 85 mol % methyltrimethoxysilane, about 15 mol % to about 60 mol % tetraethoxysilane, and about 1 mol % to about 5 mol % 2-(3,4-epoxycyclohexyl)-ethyltrimethyoxysilane; or
(vi) about 15 mol % to about 60 mol % tetraethoxysilane, about 1 mol % to about 5 mol % 2-(3,4-epoxycyclohexyl)-ethyltrimethyoxysilane, and about 15 mol % to about 70 mol % methyltriethoxysilane.

35. A composition comprising a polymer dispersed or dissolved in a solvent system, wherein said polymer comprises:
(i) about 1 mol % to about 10 mol % [3-(triethoxysilyl)propyl]succinic anhydride monomers, about 35 mol % to about 85 mol % methyltrimethoxysilane, and about 15 mol % to about 60 mol % tetraethoxysilane;
(ii) about 1 mol % to about 10 mol % [3-(triethoxysilyl)propyl]succinic anhydride monomers, about 35 mol % to about 85 mol % methyltrimethoxysilane, about 15 mol % to about 60 mol % tetraethoxysilane, and about 1 mol % to about 5 mol % 2-(3,4-epoxycyclohexyl)-ethyltrimethyoxysilane; or
(iii) about 1 mol % to about 10 mol % [3-(triethoxysilyl)propyl]succinic anhydride monomers, about 15 mol % to about 60 mol % tetraethoxysilane, about 1 mol % to about 5 mol % 2-(3,4-epoxycyclohexyl)-ethyltrimethyoxysilane, and about 15 mol % to about 70 mol % methyltriethoxysilane.

36. The composition of claim 35, wherein said polymer consists of (i), (ii), or (iii).

37. The composition of claim 35, wherein said composition consists of said polymer and said solvent system.

* * * * *